United States Patent
Yamamoto et al.

(10) Patent No.: US 7,756,654 B2
(45) Date of Patent: Jul. 13, 2010

(54) TEST APPARATUS

(75) Inventors: Kazuhiro Yamamoto, Tokyo (JP);
Toshiyuki Okayasu, Tokyo (JP)

(73) Assignee: Advantest Corporation (JP)

( * ) Notice: Subject to any disclaimer, the term of this patent is extended or adjusted under 35 U.S.C. 154(b) by 286 days.

(21) Appl. No.: 11/839,535

(22) Filed: Aug. 15, 2007

(65) Prior Publication Data
US 2009/0048796 A1    Feb. 19, 2009

(51) Int. Cl.
*G01R 11/46*    (2006.01)

(52) U.S. Cl. .............................. 702/69; 702/66; 702/67; 702/74

(58) Field of Classification Search .................... 702/69, 702/82, 89, 107, 108, 117, 182, 189, 190; 324/76.11, 765; 375/226, 371; 714/712
See application file for complete search history.

(56) References Cited

U.S. PATENT DOCUMENTS

| | | | |
|---|---|---|---|
| 4,112,264 A * | 9/1978 | Abramson et al. | 714/712 |
| 4,896,271 A * | 1/1990 | Jenq et al. | 702/72 |
| 5,748,672 A * | 5/1998 | Smith et al. | 375/226 |
| 6,970,528 B2 * | 11/2005 | Pearson | 375/371 |
| 7,002,334 B2 * | 2/2006 | Tanaka et al. | 324/76.11 |
| 7,126,366 B2 * | 10/2006 | Ohashi et al. | 324/765 |

FOREIGN PATENT DOCUMENTS

| | | |
|---|---|---|
| JP | 2000-222737 | 8/2000 |
| JP | 2004-125552 | 4/2004 |
| JP | 2004-127455 | 4/2004 |
| JP | 2006-003255 | 1/2006 |

\* cited by examiner

*Primary Examiner*—Carol S Tsai
*Assistant Examiner*—Felix E Suarez
(74) *Attorney, Agent, or Firm*—Chen Yoshimura LLP

(57) ABSTRACT

A test apparatus for testing a device under test includes a multi-strobe generating section that generates a plurality of strobe signals with different phases in each of cycles of an output signal output from the device under test, a plurality of timing comparing sections that obtain a value of the output signal respectively at timings of the plurality of strobe signals, a transition detecting section that generates transition data identifying one of the plurality of strobe signals which is positioned at a transition of the output signal, based on the values of the output signal which are respectively obtained at the timings of the plurality of strobe signals, a transition memory that sequentially stores thereon the transition data input thereto, a selecting section that selects, in association with each of the cycles of the output signal, whether to input the transition data output from the transition detecting section into the transition memory, and a calculating section that calculates jitter of the output signal based on the transition data stored on the transition memory.

15 Claims, 11 Drawing Sheets

TEST APPARATUS

BACKGROUND

1. Technical Field

The present invention relates to a test apparatus. More particularly, the present invention relates to a test apparatus for testing a device under test such as a semiconductor chip.

2. Related Art

When a device under test such as a semiconductor chip is tested, the test may be performed to measure the amount of jitter contained in an output signal from the device under test. The jitter represents, for example, a difference in time between the edge timing of an ideal signal and the edge timing of an actual signal. Therefore, the jitter can be measured by measuring the edge timing of the actual signal.

For example, the logical value of the output signal is sampled at a predetermined sampling interval, and the samples are stored on a memory. The data on the memory is analyzed so as to detect the logical transition timing of the output signal. Here, a difference in time between the timing of each transition and the timing of a corresponding ideal transition is acquired. In this way, the timing jitter of the output signal can be obtained (for example, see Unexamined Japanese Patent Application Publication No. 2004-125552).

Here, the measured jitter is equivalent to accumulation of various types of jitter caused by many different factors. The jitter is generated by a variety of factors including, for example, power source noise in the device under test, clock noise, noise in each circuit block, and measurement noise. Here, the conventional jitter measuring technique has difficulties in analyzing the measurement result stored on the memory to identify factors that cause a particular type of jitter.

SUMMARY

Therefore, it is an object of an aspect of the innovation herein to provide a test apparatus which is capable of overcoming the above drawbacks accompanying the related art. The above and other objects can be achieved by combinations described in the independent claims. The dependent claims define further advantageous and exemplary combinations of the present invention.

According to an aspect related to the innovations herein, one exemplary apparatus may include a test apparatus for testing a device under test. The test apparatus includes a multi-strobe generating section that generates a plurality of strobe signals with different phases in each of cycles of an output signal output from the device under test, a plurality of timing comparing sections that obtain a value of the output signal respectively at timings of the plurality of strobe signals, a transition detecting section that generates transition data identifying one of the plurality of strobe signals which is positioned at a transition of the output signal, based on the values of the output signal which are respectively obtained at the timings of the plurality of strobe signals, a transition storing section that stores thereon the transition data input thereto, a selecting section that selects, in association with each of the cycles of the output signal, whether to input the transition data output from the transition detecting section into the transition storing section, and a calculating section that calculates jitter of the output signal based on the transition data stored on the transition storing section.

Here, all the necessary features of the present invention are not listed in the summary. The sub-combinations of the features may become the invention.

DESCRIPTION OF EXEMPLARY EMBODIMENTS

An aspect of the invention will now be described based on an embodiment, which does not intend to limit the scope of the present invention, but exemplifies the invention. All of the features and the combinations thereof described in the embodiment are not necessarily essential to the invention.

Figure 1:
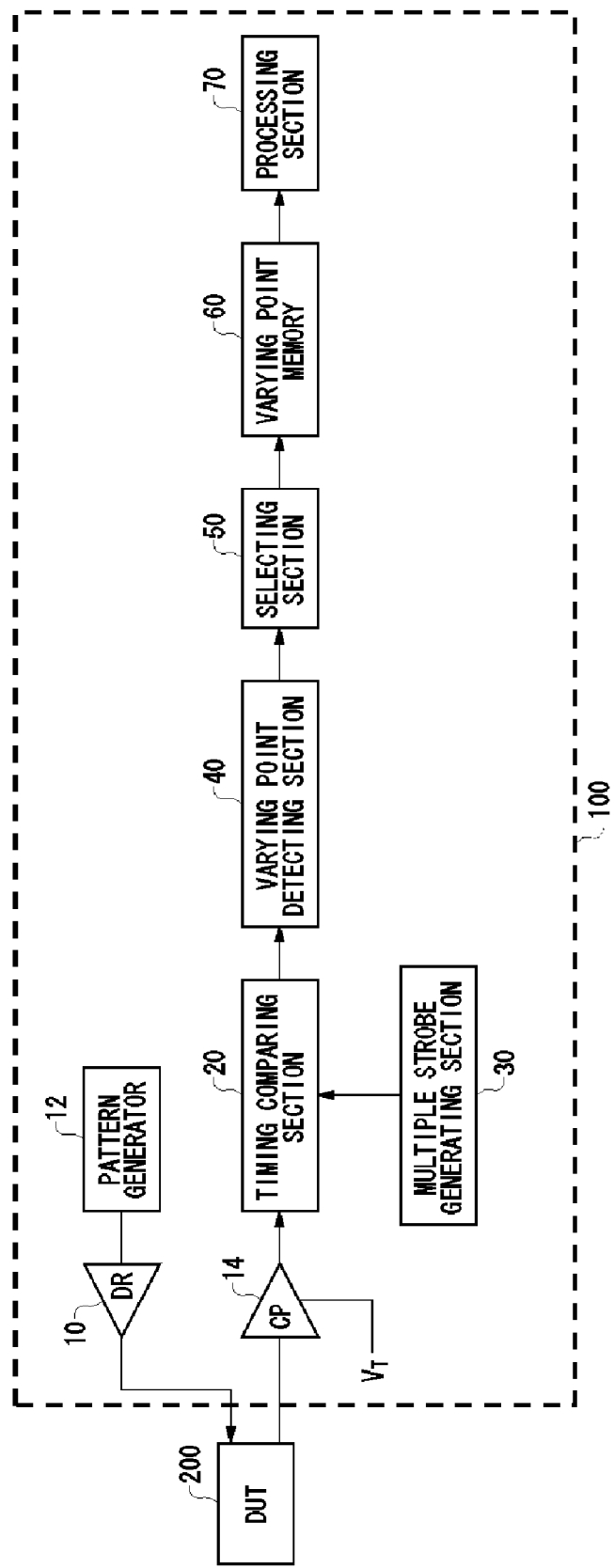
FIG. 1 illustrates an exemplary configuration of a test apparatus 100 relating to one embodiment of the present invention.

FIG. 1 illustrates an exemplary configuration of a test apparatus 100 relating to one embodiment of the present invention. The test apparatus 100 tests a device under test 200 such as a semiconductor chip. For example, the test apparatus 100 may perform a jitter test by measuring jitter of an output signal output from the device under test 200 and then judging whether the device under test 200 passes or fails the test. In addition to the function of performing the jitter test, the test apparatus 100 may have a function of performing a function test by measuring a logical value pattern of the output signal output from the device under test 200 and then judging whether the device under test passes or fails the test. The test apparatus 100 includes therein a pattern generator 12, a driver 10, a level comparing section 14, a timing comparing section 20, a multi-strobe generating section 30, a transition detecting section 40, a selecting section 50, a transition memory 60 and a processing section 70.

The pattern generator 12 generates a test signal having a predetermined logical value pattern, and inputs the generated test signal into the device under test 200 via the driver 10. The driver 10 may shape the waveform of the test signal, and input the test signal with the shaped waveform into the device under test 200.

The level comparing section 14 compares the level of the output signal from the device under test 200 with a reference level supplied thereto, and outputs a result of the comparison. For example, the level comparing section 14 may output an H logic during a period in which the level of the output signal is higher than the reference level, and output an L logic during a period in which the level of the output signal is equal to or lower than the reference level.

The multi-strobe generating section 30 generates a plurality of strobe signals having different phases in each cycle of the output signal. For example, the multi-strobe generating section 30 may generate, in each cycle of the output signal, a plurality of strobe signals which are arranged at substantially equal intervals along the time domain. The timing comparing section 20 obtains the logical value of the output signal at the timings indicated by the strobe signals supplied thereto from the multi-strobe generating section 30. To be specific, the timing comparing section 20 obtains the value of the output signal at a plurality of timings corresponding to the plurality of strobe signals, within one cycle of the output signal.

The transition detecting section 40 detects the timing of a transition (an edge) in association with each cycle of the output signal, based on the values of the output signal which are obtained at the respective timings of the plurality of strobe signals. For example, the transition detecting section 40 may detect one of the strobe signals which indicates a timing at which the logical value of the output signal transits in association with each cycle, and generate transition data identifying the detected strobe signal in association with each cycle of the output signal. For example, the transition detecting section 40 may generate the transition data in accordance with the number of strobe signals which are arranged along the time domain within the cycle prior to the strobe signal detecting the transition. The transition detecting section 40 may detect the timing of the transition in each one of the successive cycles of the output signal, within a predetermined time interval.

The selecting section 50 selects, in association with each cycle of the output signal, whether to input the transition data output from the transition detecting section 40 into the transition memory 60. For example, for the purpose of measuring jitter caused by a particular factor, the selecting section 50 selects the transition data generated in a cycle in which jitter occurs due to the particular factor, and inputs the selected transition data into the transition memory 60.

For example, the selecting section 50 may select the transition data in a cycle in which the device under test 200 is in a predetermined state, and input the selected transition data into the transition memory 60. In this way, the test apparatus 100 can selectively measure jitter which is caused when the device under test 200 is in a particular state.

The transition memory 60 is shown as an example of a transition storing section for storing thereon transition data. The transition memory 60 sequentially stores thereon transition data input from the selecting section 50. When the test apparatus 100 is configured differently, a transition counter may be alternatively provided as the transition storing section. The transition counter may store thereon the transition data by counting the number of times at which the transition is detected in association with each of the candidates as the position of the transition (for example, each of the phases of the strobe signals in each cycle one of which detects the transition). Alternatively, both of the transition memory 60 and the transition counter may be provided as the transition storing section. The processing section 70 analyzes the transition data stored on the transition storing section (in the present example, the transition memory 60). The processing section 70 may conduct the data processing based on one or both of hardware and software.

For example, the processing section 70 calculates the jitter of the output signal based on each of the pieces of transition data stored on the transition memory 60. When the selecting section 50 selects the transition data corresponding to the cycle in which the device under test 200 is in a predetermined state and inputs the selected transition data into the transition memory 60 as described above, the processing section 70 can calculate the jitter which is caused when the device under test 200 is in a particular state. The selecting section 50 may input the transition data into the transition memory 60 in association with each state of the device under test 200. If this is the case, the processing section 70 can analyze jitter in association with each of the states into which the device under test 200 may enter.

Here, the predetermined state of the device under test 200 may be observed, for example, as a state in one cycle, or as a state of variation over a plurality of cycles. For example, the predetermined state may be a state in which a predetermined flip-flop included in the device under test 200 maintains a predetermined logical value (the state in one cycle), or may be a state in which the logical value pattern made up by the logical values which are sequentially maintained at the predetermined flip-flop over a plurality of cycles is the same as a predetermined logical value pattern (the state over a plurality of cycles).

When the test apparatus 100 performs the function test on the device under test 200, the processing section 70 may compare the output signal detected by the timing comparing section 20 with a predetermined expected pattern signal, in order to judge whether the device under test 200 correctly functions. For example, the processing section 70 may compare the logical value pattern of the output signal with the logical value pattern of the expected pattern signal, in order to judge whether the device under test 200 correctly functions. The expected pattern signal may be generated by the pattern generator 12 in accordance with the test signal. For example, the pattern generator 12 may generate the expected pattern signal which has a logical value pattern corresponding to the logical value pattern of the test signal.

According to the present example, the test apparatus 100 measures one output-signal. According to a different example, however, the test apparatus 100 may measure a plurality of output signals in parallel. If such is the case, the test apparatus 100 may include therein a plurality of combinations of the constituents shown in FIG. 1.

Figure 2:
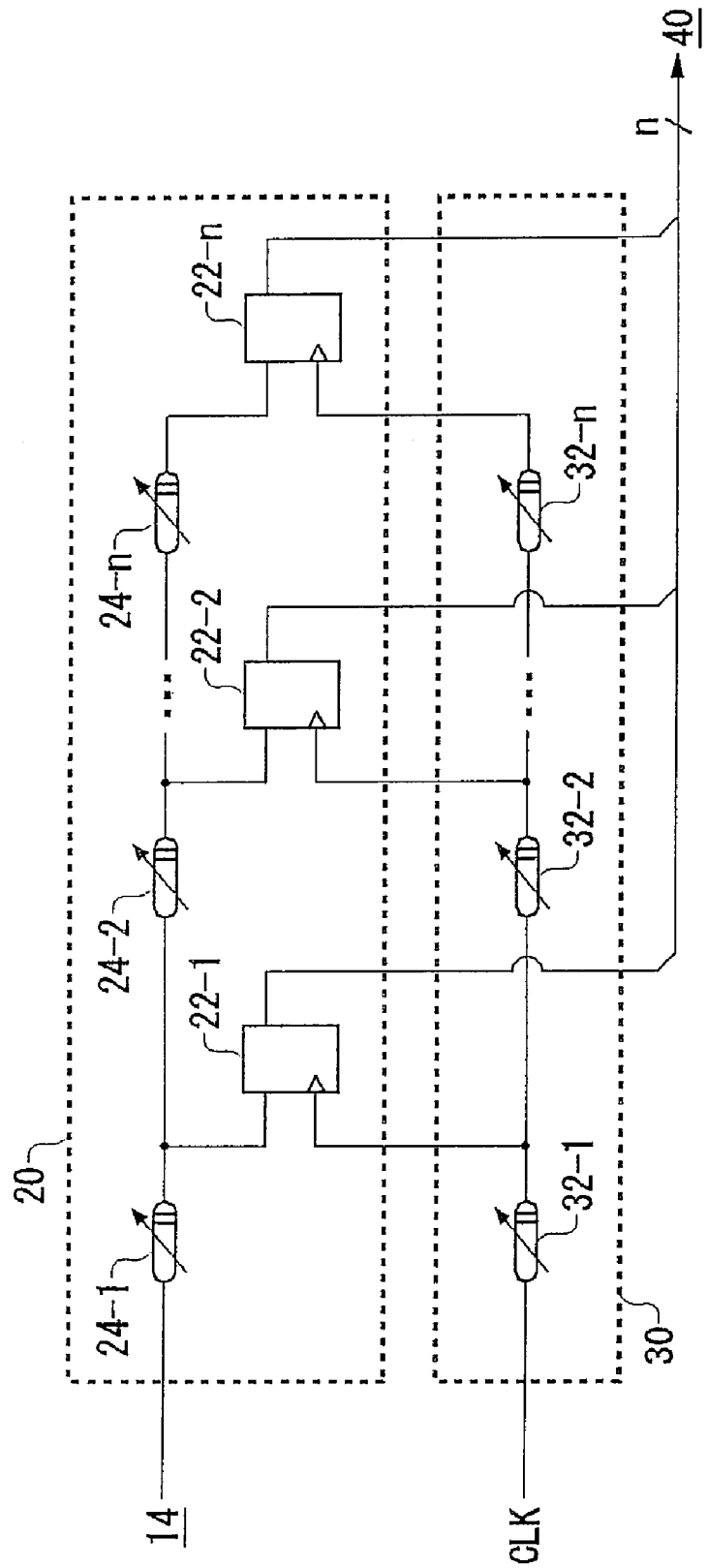
FIG. 2 illustrates an exemplary configuration of a timing comparing section 20 and an exemplary configuration of a multi-strobe generating section 30.

FIG. 2 illustrates an exemplary configuration of the timing comparing section 20 and an exemplary configuration of the multi-strobe generating section 30. As described above, the multi-strobe generating section 30 outputs a multi-strobe having a plurality of strobe signals with different phases in each cycle of the output signal. The multi-strobe generating section 30 relating to the present example includes therein a plurality of delay elements which are cascaded to each other (32-1, 32-2, . . . and 32-n, hereinafter collectively referred to as the delay elements 32, and it should be noted that n is a natural number).

The multi-strobe generating section 30 can generate a plurality of strobe signals with different phases by extracting signals respectively output from the plurality of delay elements 32. The delay element 32-1 of the first stage receives a clock signal in which pulses are arranged at the same period as in the output signal. In this manner, the multi-strobe generating section 30 can generate a plurality of strobe signals with different phases in each cycle of the output signal.

Here, the sum of the delays generated by the plurality of delay elements 32 may be smaller than the duration of one cycle of the output signal. In addition, each of the delay elements 32 may have the same delay amount. With such a configuration, the multi-strobe generating section 30 can generate a plurality of strobe signals which are arranged at equal intervals along the time domain. Alternatively, the delay amounts of the delay elements 32 may be adjusted in accordance with the pattern in which the plurality of strobe signals are expected to be arranged along the time domain.

The delay amounts of the delay elements 32 may be fixed or variable. For example, the delay amounts of the delay elements 32 may be adjustable in accordance with the measurement resolution with which the jitter is expected to be measured.

The timing comparing section 20 includes therein a plurality of flip-flops 22 which are provided in a one-to-one correspondence with the plurality of delay elements 32. Each of the flip-flops 22 obtains the logical value of the output signal output from the level comparing section 14 at a timing indicated by the strobe signal output from a correspondence one of the delay elements 32.

Each of the flip-flops 22 may receive the logical value of the output signal output from the level comparing section 14 via a transmission path which has substantially the same transmission delay amount. With the above-described configuration, the timing comparing section 20 obtains the logical value of the output signal at the timings determined in accordance with the delay amounts of the delay elements 32.

As illustrated in FIG. 2, the timing comparing section 20 may further include therein a plurality of delay elements which are cascaded to each other (24-1, 24-1, . . . and 24-n, hereinafter collectively referred to as the delay elements 24). The plurality of delay elements 24 are provided in a one-to-one correspondence with the plurality of delay elements 32.

The delay element 24 of the first stage receives the logical value output from the level comparing section 14. Each of the delay elements 24 sequentially delays the logical value input thereto, and inputs the delayed logical value into the delay element 24 of the following stage. Each of the delay elements 24 may have the same delay amount. Here, the delay amounts of the delay elements 24 are set at a different value from the delay amounts of the delay elements 32.

Each of the flip-flops 22 obtains the logical value output from a corresponding one of the delay elements 24 at the timing of the strobe signal output from a corresponding one of the delay elements 32. With such a configuration, the timing comparing section 20 obtains the logical value of the output signal at a plurality of timings of different phases which are determined in accordance with the differences in delay amount between the delay elements 24 and delay elements 32. As described above, the phase differences between the strobe signals are determined by the differences in delay amount between the delay elements 24 and delay elements 32 in the present example. As a result, the timing comparing section 20 is capable of sampling the logical value of the output signal with a temporal resolution which is smaller than the minimum delay amount which can possibly be generated by the delay elements 32.

The logical value obtained by each of the flip-flops 22 is input into the transition detecting section 40. When the number of the flip-flops 22 provided is n, for example, n-bit data is input into the transition detecting section 40 in association with each cycle of the output signal. Here, adjacent bits in the data indicate logical values of the output signal which are detected at the timings of strobe signals adjacent to each other along the time domain. In other words, the value of each bit in the data input into the transition detecting section 40 in association with each cycle is the logical value obtained in the cycle by one of the flip-flops 22 which corresponds to the bit.

Figure 3:
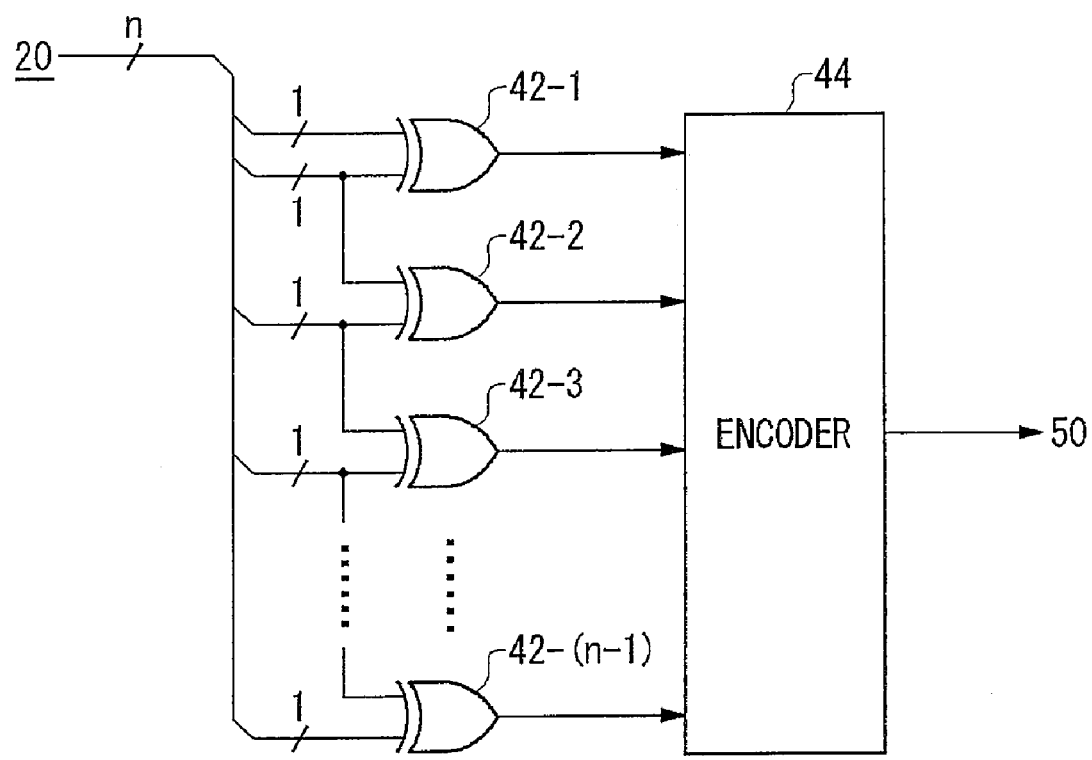
FIG. 3 illustrates an exemplary configuration of a transition detecting section 40.

FIG. 3 illustrates an exemplary configuration of the transition detecting section 40. The transition detecting section 40 includes therein a plurality of XOR circuits 42 and an encoder 44. Each of the XOR circuits 42 outputs a logical XOR between the logical values of adjacent bits in the data that is input into the transition detecting section 40 from the timing comparing section 20 in association with each cycle.

Each of the XOR circuits 42 outputs a logical value "1" when there is a transition between the logical values of the bits input thereto, and outputs a logical value "0" when there is not a transition between the logical values of the bits input thereto. That is to say, each of the XOR circuits 42 outputs the logical value "1" when the logical value of the output signal transits between the corresponding two strobe signals, and outputs the logical value "0" when the logical value of the output signal does not transit between the corresponding two strobe signals. As a consequence, the transition detecting section 40 can detect the timing, along the time domain, of the transition in association with each cycle of the output signal, by detecting the position (the number) of one of the XOR circuits 42 which outputs the logical value "1" in association with each cycle.

The encoder 44 receives, in association with each cycle of the output signal, the logical values output from the respective XOR circuits 42. For example, the encoder 44 receives (n–1)-bit data in association with each cycle of the output signal. The encoder 44 generates, for example, binary data which represents the position of the bit in the received data which indicates the logical value "1", and outputs the generated binary data to the selecting section 50. By performing such an operation, the encoder 44 can compress the bit width of the transition data.

Figure 4:
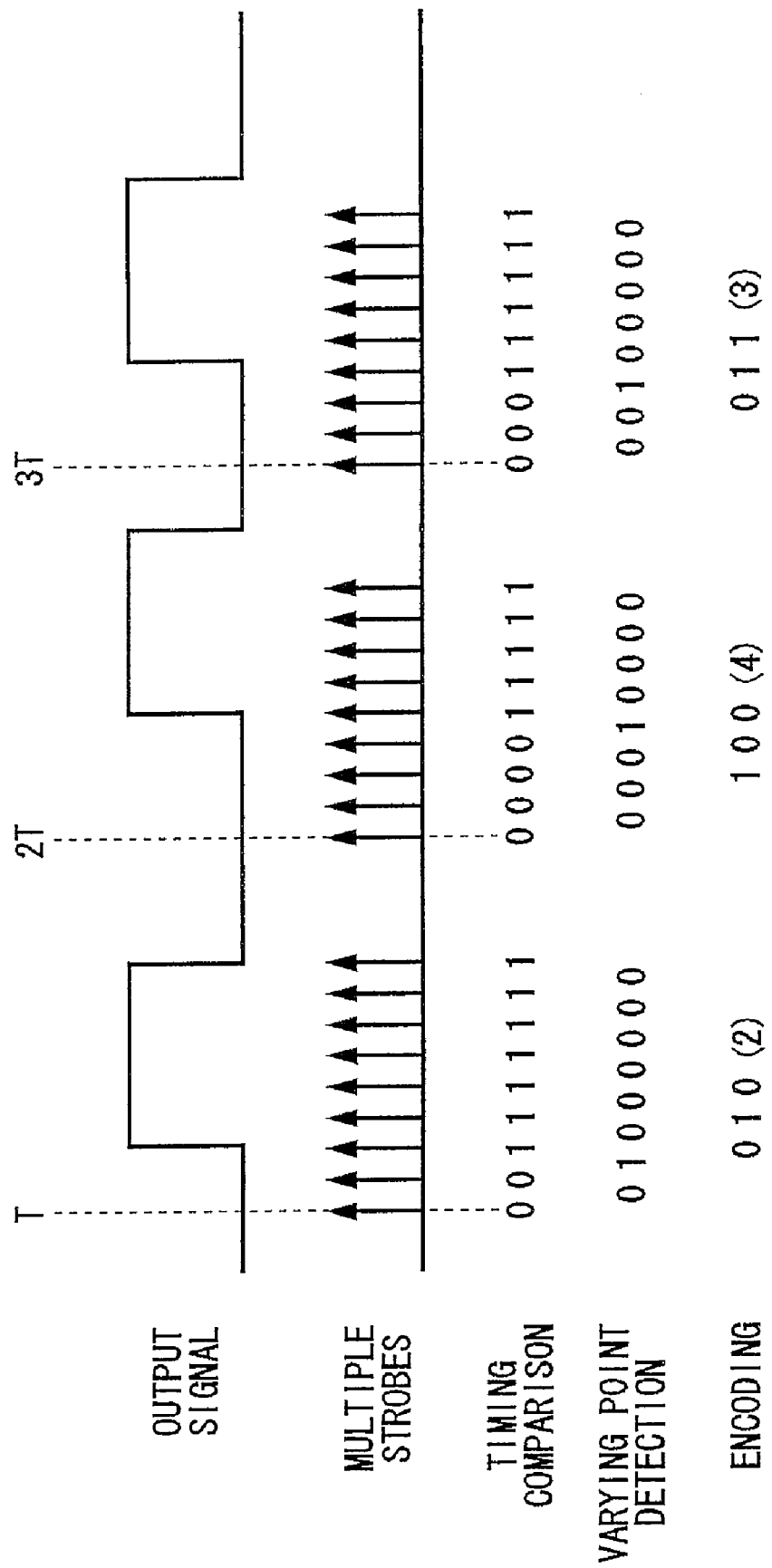
FIG. 4 is a timing chart illustrating an exemplary operation performed by the timing comparing section 20 and an exemplary operation performed by the transition detecting section 40.

FIG. 4 is a timing chart illustrating an exemplary operation performed by the timing comparing section 20 and exemplary operation performed by the transition detecting section 40. In FIG. 4, the reference sign T denotes an ideal cycle time of the output signal. The multi-strobe generating section 30 generates a plurality of strobe signals in each of the cycles T-2T, 2T-3T, 3T-4T, . . . . The multi-strobe generating section 30 may generate, in each cycle of the output signal, a plurality of strobe signals which are arranged over the entire cycle, or generate a plurality of strobe signals which are arranged over a predetermined period of the cycle as illustrated in FIG. 4. For example, when the transition detecting section 40 desires to detect a rising transition of the output signal, the multi-strobe generating section 30 may generate a plurality of strobe signals which are arranged in the former half of each cycle of the output signal.

The timing comparing section 20 obtains the logical value of the output signal at the timings of the strobe signals. The obtained result is input into the transition detecting section 40 in association with each cycle of the output signal. The plurality of XOR circuits 42 of the transition detecting section 40 detect, for each cycle of the output signal, the position of the bit in the received data at which the logical value transits. The encoder 44 then outputs binary data which represents the position of the bit detected by the XOR circuits 42. For example, the XOR circuits 42 detect the second bit in the cycle from T to 2T, and the encoder 44 outputs data "010" as the transition data.

Figure 5A:
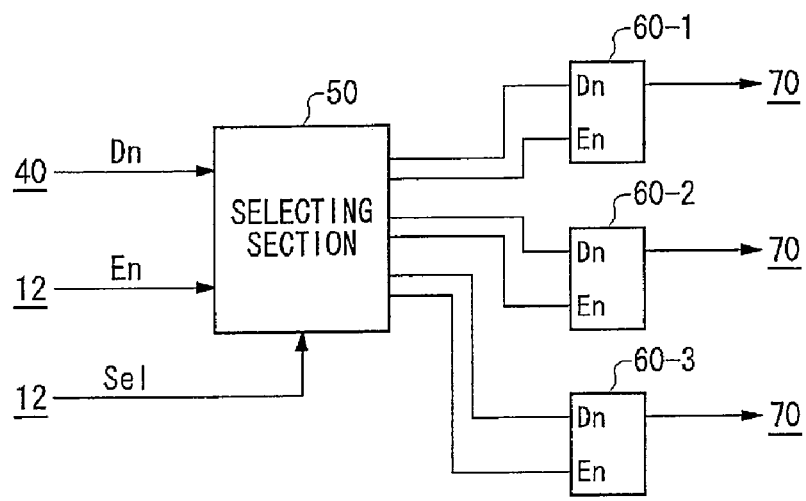
FIG. 5A is used to explain an exemplary operation of a selecting section 50.

FIG. 5A is used to explain an exemplary operation performed by the selecting section 50. As mentioned above, the selecting section 50 selects transition data generated by the transition detecting section 40, which is associated with the cycle in which jitter is expected to be measured, and inputs the selected transition data into the transition memory 60. According to the present example, the cycle in which jitter is expected to be measured may be designated by an enable signal En output from the pattern generator 12.

For example, the pattern generator 12 may generate the enable signal which designates whether the jitter of the output signal is to be measured in each cycle of the output signal, in place of the expected pattern signal generated when the test apparatus 100 performs the function test on the device under test 200. The enable signal may be supplied in synchronization with the output signal. For example, the pattern generator 12 may generate the enable signal which indicates the logical value "1" in cycles that are designated in advance by a user or the like and indicates the logical value "0" in the other cycles. The selecting section 50 inputs, into the transition memory 60, the transition data associated with the cycles for which the enable signal indicates the logical value "1".

The pattern generator 12 may output, as the enable signal, a signal which is the same as the expected pattern signal generated when the test apparatus 100 performs the function test on the device under test 200. In other words, the pattern generator 12 may output, as the enable signal, the expected pattern signal which is expected to be generated by the pattern generator 12 when the test signal which is supposed to be input into the device under test 200 for the jitter test is instead input into the device under test 200 in order that the test apparatus 100 performs the function test. The selecting section 50 inputs, into the transition memory 60, the transition data associated with the cycle for which the enable signal indicates a predetermined logical value.

Furthermore, when the logical value pattern in a plurality of cycles of the enable signal is the same as a predetermined logical value pattern, the selecting section 50 may input into the transition memory 60 a plurality of pieces of transition data associated with the plurality of cycles. The selecting section 50 may include therein a buffer which temporarily stores thereon pieces of transition data associated with a plurality of cycles output from the transition detecting section 40. Here, the predetermined logical value pattern may be designated in advance by the user or the like. For example, when desiring to measure jitter which is to be generated when the device under test 200 is in a particular state, the user or the like may designate, as the predetermined logical value pattern, the logical value pattern of the output signal which is estimated to be output from the device under test 200 in the particular state.

The predetermined logical value pattern may be generated by the pattern generator 12. For example, the pattern generator 12 may generate the predetermined logical value pattern based on the logical value pattern of the test signal which is expected to be input into the device under test 200 to cause the device under test 200 to enter into the above-mentioned particular state. Alternatively, a simulator which simulates the operation of the device under test 200 may be used to obtain the logical value pattern of the output signal which is expected to be output from the device under test 200 in response to the above-mentioned test signal, and the obtained logical value pattern may be utilized as the predetermined logical value pattern.

Here, the test apparatus 100 may include therein a plurality of transition memories 60. The plurality of transition memories 60 may indicate a plurality of different address domains in the same memory, or a plurality of separate memories. When the test apparatus 100 includes therein a plurality of transition memories 60, the selecting section 50 may control, in association with each cycle, which one of the transition memories 60 receives the selected transition data. According to the present example, one of the transition memories 60 which receives the transition data may be controlled by a memory control signal sel output from the pattern generator 12.

For example, it is assumed to measure a plurality of kinds of jitter which may be generated in accordance with different states of the device under test 200. In this case, the pattern generator 12 may generate the memory control signal which causes each piece of transition data to be input into one of the transition memories 60 which corresponds to the state of the device under test 200 in the cycle associated with the transition data. The pattern generator 12 may generate the memory control signal sel, based on the state in which the device under test 200 is judged to be in each cycle. Here, the judgment is made in accordance with the logical value pattern of the test signal input into the device under test 200.

The selecting section 50 may have a logical value pattern (hereinafter referred to as a state-unique pattern) which the output signal from the device under test 200 is expected to have when the device under test 200 is in a particular state. A plurality of state-unique patterns are defined in a one-to-one correspondence with the plurality of transition memories 60. When the logical value pattern of the enable signal matches one of the state-unique patterns, the selecting section 50 may input the pieces of transition data for the cycles that are associated with the matching logical value pattern into one of the transition memories 60 which corresponds to the matching state-unique pattern. In this case, the enable signal includes the data designating one or more cycles for which jitter is expected to be measured and the data designating a memory into which the transition data is expected to be input. In other words, the enable signal is also used as the memory control signal.

Figure 5B:
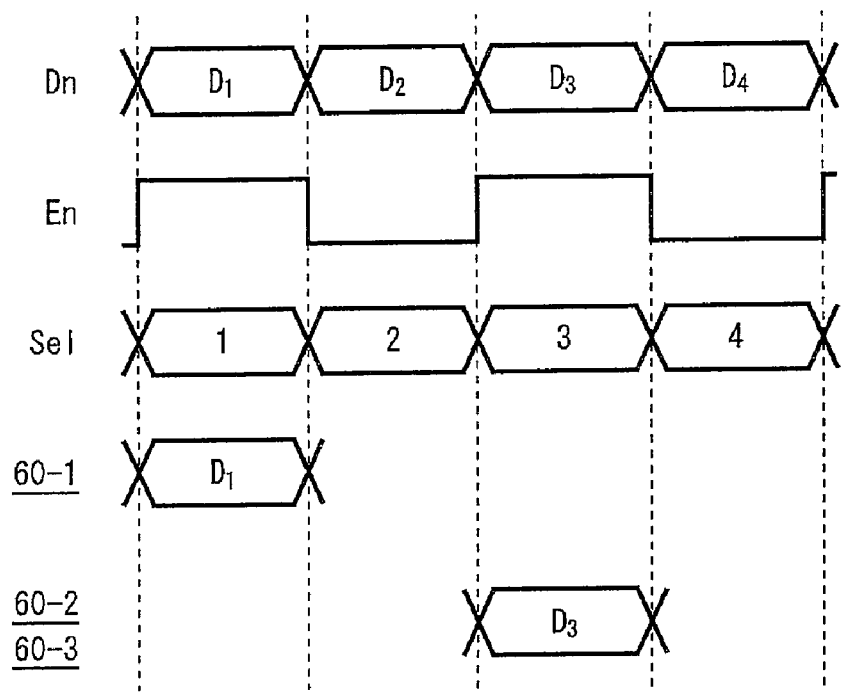
FIG. 5B is a timing chart illustrating the exemplary operation of the selecting section 50 explained with reference to FIG. 5A.

FIG. 5B is a timing chart illustrating the exemplary operation of the selecting section 50 explained with reference to FIG. 5A. In FIG. 5B, Dn denotes the transition data output from the transition detecting section 40 in each cycle. As described above, the selecting section 50 inputs the transition data associated with the cycle which is designated by the enable signal En, into one of the transition memories 60 which is designated by the memory control signal sel.

According to the example shown in FIG. 5B, the data D1 of a first cycle is input into a first transition memory 60-1, and the data D3 of a third cycle is input into a third transition memories 60-3. Such an operation makes it possible to easily analyze the jitter of the output signal. For example, since each piece of transition data is stored into one of the transition memories 60 which is associated with the corresponding state of the device under test 200, the test apparatus 100 can analyze the jitter associated with each state. As a result, the test apparatus 100 can analyze what causes jitter to occur in the output signal.

Figure 6A:
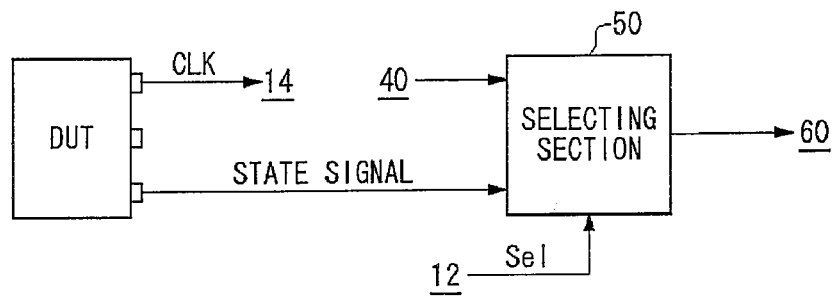
FIG. 6A is used to explain another exemplary operation performed by the selecting section 50.

FIG. 6A is used to explain another exemplary operation performed by the selecting section 50. According to the present example, the selecting section 50 selects, in association with each cycle, whether to input the transition data into the transition memory 60 in accordance with the value of a state signal output from the device under test 200 in the corresponding cycle. Here, the state signal is a signal whose logical value or logical value pattern varies in accordance with the state of the internal circuit of the device under test 200. The state signal is preferably synchronized with the output signal from the device under test 200.

When the device under test 200 is a source synchronous device, for example, the test apparatus 100 may receive a clock signal DQS output from the device under test 200 as the output signal, and receive a data signal DQ output from the device under test 200 as the state signal. If such is the case, the logical value of the state signal varies in accordance with the state of the internal circuit. Alternatively, the test apparatus 100 may receive one output data signal from the device under test 200 as the output signal, and receive a different output data signal from the device under test 200 as the state signal. Alternatively, the test apparatus 100 may receive one output data signal from the device under test 200 as the output signal and the state signal.

The selecting section 50 judges, in association with each cycle, whether the logical value or logical value pattern of the state signal matches a predetermined logical value or logical value pattern, and inputs into the transition memory 60 the transition data associated with the cycle for which a positive judgment is made. For example, when the logical value or logical value pattern of the state signal is judged to match the logical value or logical value pattern which is determined in accordance with the state of the device under test 200 for which jitter is expected to be measured, the selecting section 50 may input into the transition memory 60 the transition data associated with the cycle for which a positive judgment is made.

Furthermore, the selecting section 50 may have a plurality of logical values or logical value patterns (hereinafter referred to as a plurality of state-unique patterns) which the state signal is expected to have, in association with a plurality of states into which the device under test 200 may enter. Here, the plurality of state-unique patterns are defined in a one-to-one correspondence with the plurality of transition memories 60. When the logical value pattern of the state signal matches any one of the plurality of state-unique patterns, the selecting section 50 may input the transition data associated with the cycle corresponding to the matching logical value pattern, into one of the transition memories 60 which is associated with the matching state-unique pattern. In this case, the state signal is also used as the memory control signal. Alternatively, the memory control signal may be generated by the pattern generator 12 similarly to the case explained with reference to FIGS. 5A and 5B.

Figure 6B:
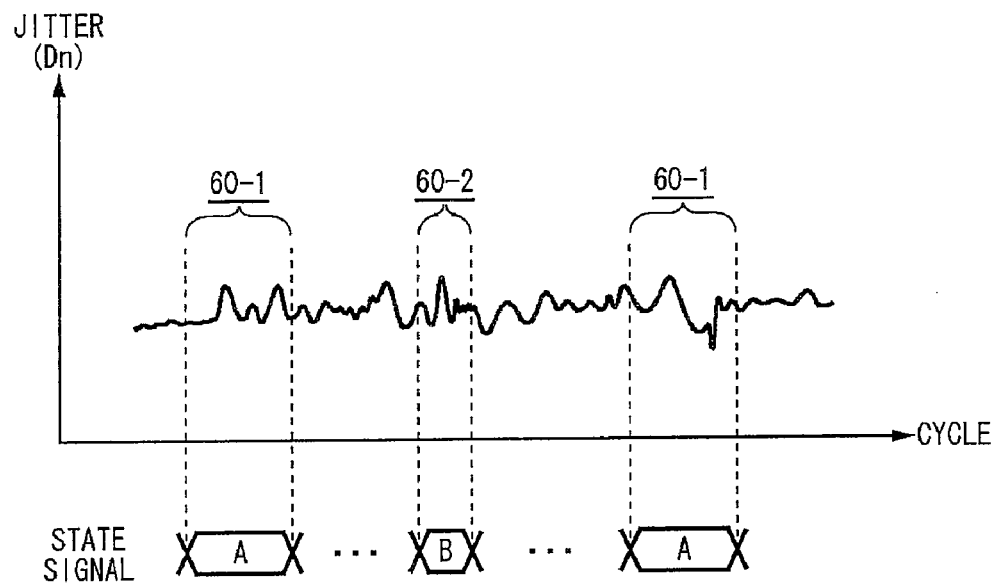
FIG. 6B is a timing chart illustrating the exemplary operation of the selecting section 50 explained with reference to FIG. 6A.

FIG. 6B is a timing chart illustrating the exemplary operation of the selecting section 50 explained with reference to FIG. 6A. According to the present example, A and B denote the logical patterns of the state signal which are observed when the device under test 200 is in such a state that jitter is expected to be measured.

As described above, the selecting section 50 detects such a cycle that the logical pattern of the state signal matches the logical pattern A, and inputs the transition data associated with the detected cycle into the first transition memory 60-1. Also, the selecting section 50 detects such a cycle that the logical pattern of the state signal matches the logical pattern B, and inputs the transition data associated with the detected cycle into the second transition memory 60-2. Such an operation makes it possible to easily analyze the jitter of the output signal, similarly to the case explained with reference to FIGS. 5A and 5B. For example, such an operation makes it possible to easily analyze jitter associated with a particular state of the device under test 200, jitter unique to a particular logical value pattern of the output signal, and the like.

For example, there may be a difference between jitter which occurs in a transition at which the logical value transits to "0" after the logical value stays at "1" in a plurality of successive cycles and jitter which occurs in a transition at which the logical value transits to "0" not after successive cycles of the logical value "1" (i.e. after the logical value shows "1" in one cycle). According to the present example, the test apparatus 100 can measure jitter in association with a particular logical value pattern, thereby making it possible to easily analyze such jitter unique to a particular pattern.

Figure 7A:
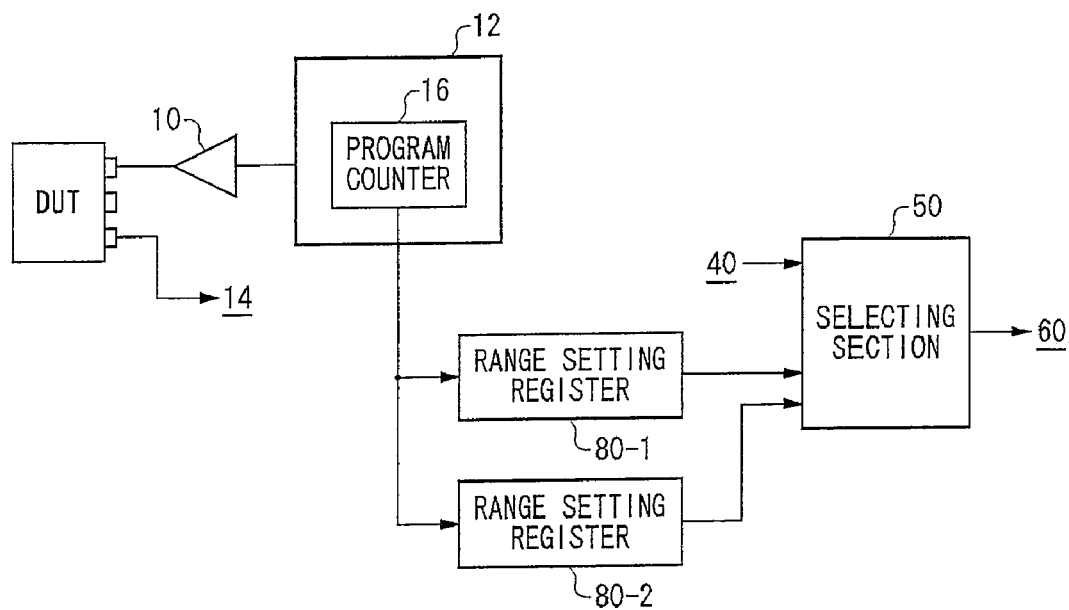
FIG. 7A is used to explain another exemplary operation performed by the selecting section 50.

FIG. 7A is used to explain another exemplary operation performed by the selecting section 50. According to the present example, the pattern generator 12 executes a test program supplied thereto, to generate a test pattern. For example, the test program includes therein a set of instructions to be executed by the pattern generator 12. The pattern generator 12 may sequentially generate test patterns by sequentially executing the set of instructions, and sequentially input the generated test patterns into the device under test 200. Here, the order in which the instructions are to be executed by the pattern generator 12 may be designated by the value of the address or the like generated by a program counter 16.

The logical patterns of the test signal are determined by the instructions which are executed to generate the logical patterns. In other words, the state of the device under test 200 varies in accordance with the instructions which are executed to generate the test signal input into the device under test 200. Therefore, it is possible to measure jitter which is generated when the device under test 200 is in a predetermined state, by measuring the jitter of the output signal which is output from the device under test 200 when a predetermined instruction or instruction set is executed.

The selecting section 50 may input into the transition memory 60 the transition data associated with the cycle in which a predetermined instruction or instruction set is executed. For example, as illustrated in FIG. 7A, the test apparatus 100 includes therein a range setting register 80 for storing thereon a range for the value of the program counter 16, which indicates a range in the program for which the jitter of the output signal is expected to be measured. While the test program is being executed, the selecting section 50 may sequentially input into the transition memory 60 the transition data associated with each cycle, under the condition that the value shown by the program counter 16 falls within the range designated by the range setting register 80.

Alternatively, the test apparatus 100 may include therein a plurality of range setting registers 80 that respectively store thereon different ranges for the value of the program counter 16. Also, there may be a plurality of transition memories 60 provided in a one-to-one correspondence with the plurality of range setting registers 80.

While the test program is being executed, the selecting section 50 judges, in association with each cycle, whether the value of the program counter 16 falls within the range designated by any of the range setting registers 80. When the value of the program counter 16 is judged to fall within the range designated by any one of the range setting registers 80, the selecting section 50 sequentially inputs into, one of the transition memories 60 which is associated with the range setting register 80, the transition data associated with the cycle.

Alternatively, each of the range setting registers 80 may judge, in association with each cycle, whether the value of the program counter 16 falls within the range designated by itself, and notify the selecting section 50 of the judgment. The selecting section 50 may select whether to store the transition data associated with each cycle into any one of the transition memories 60, in accordance with the judgment results notified by the respective range setting registers 80.

Figure 7B:
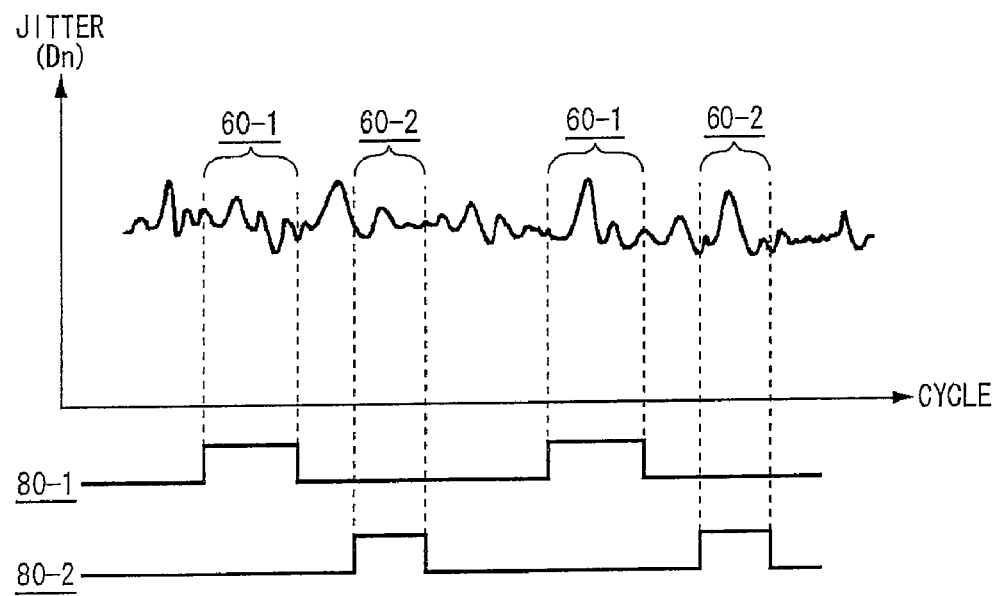
FIG. 7B is a timing chart illustrating the exemplary operation of the selecting section 50 explained with reference to FIG. 7A.

FIG. 7B is a timing chart illustrating the exemplary operation of the selecting section 50 explained with reference to FIG. 7A. According to the present example, each of the range setting registers 80 notifies the selecting section 50 of the judgment as to whether the value of the program counter 16 falls within the range designated by itself. As described above, when the value of the program counter 16 is judged to fall within one of the designated ranges in a given cycle, the selecting section 50 inputs the transition data associated with the given cycle into one of the transition memories 60 which is associated with the range judged to include the value of the program counter 16. Such an operation makes it possible to easily analyze the jitter of the output signal, similarly to the case explained with reference to FIGS. 5A and 5B.

Figure 8A:
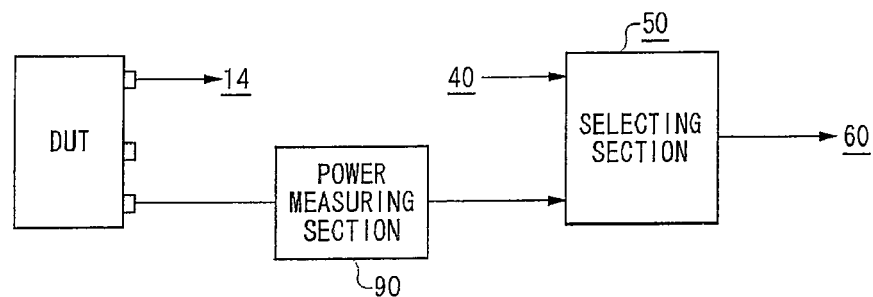
FIG. 8A is used to explain another exemplary operation performed by the selecting section 50.

FIG. 8A is used to explain another exemplary operation performed by the selecting section 50. According to the present example, the selecting section 50 selects whether to input the transition data into the transition memory 60, in accordance with the power consumption of the device under test 200. For example, when the mean or maximum value of the power consumption of the device under test 200 is higher than a predetermined reference value in a given cycle, the selecting section 50 may input the transition data associated with the given cycle into the transition memory 60.

According to the present example, the test apparatus 100 further includes therein a power measuring section 90 for measuring the power consumption of the device under test 200. The power measuring section 90 may calculate, in association with each cycle, the mean value of the power supplied to the device under test 200 from the power source. The power measuring section 90 may also notify, in association with each cycle, the selecting section 50 of the judgment as to whether the mean value of the power consumption in the cycle is higher than the predetermined reference value. The selecting section 50 may select whether to input the transition data associated with the cycle into the transition memory 60, in accordance with the comparison result between the power consumption and the reference value which is notified by the power measuring section 90.

In addition, the selecting section 50 may select one of the transition memories 60 which is to store thereon the transition data associated with each cycle, in accordance with the power consumption of the device under test 200 in the cycle. For example, the power measuring section 90 may have a plurality of power ranges, and notify, in association with each cycle, the selecting section 50 of the power range to which the power consumption of the device under test 200 belongs. The selecting section 50 may select whether to store the transition data associated with the cycle into any one of the transition memories 60, in accordance with the power range which is notified by the power measuring section 90.

Figure 8B:
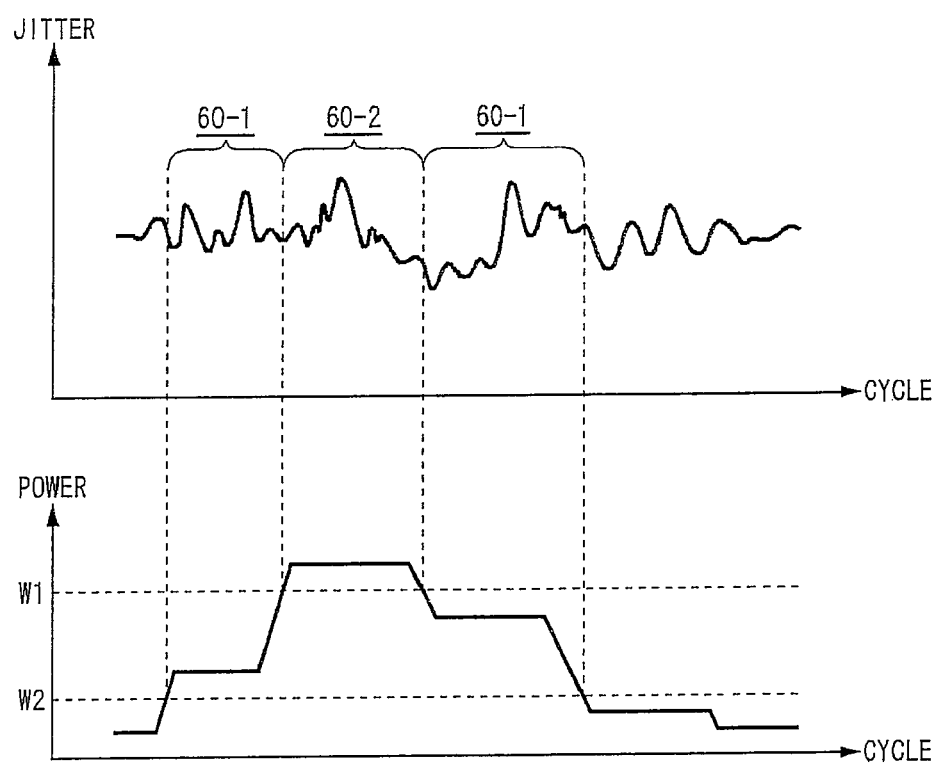
FIG. 8B is a timing chart illustrating the exemplary operation of the selecting section 50 explained with reference to FIG. 8A.

FIG. 8B is a timing chart illustrating the exemplary operation of the selecting section 50 explained with reference to FIG. 8A. According to the present example, the power measuring section 90 compares the mean value of the power consumption of the device under test 200 in each cycle with predetermined power values W1 and W2, so as to notify, in association with each cycle, the selecting section 50 of data indicating which one of the power ranges (0-W2, W2-W1, W1- . . . ) has the mean value therein.

The selecting section 50 selects, in association with each cycle, whether to store the transition data associated with the cycle into any one of the transition memories 60, in accordance with the data indicating one of the power ranges which is notified by the power measuring section 90 in the cycle. According to the present example, when the mean value of the power consumption falls within the zero-th power range (0-W2), the selecting section 50 does not input the transition data associated with the cycle into any of the transition memories 60. When the mean value of the power consumption falls within the first power range (W2-W1), the selecting section 50 inputs the transition data associated with the cycle into the first transition memory 60-1. When the mean value of the power consumption falls within the second power range (W1 the selecting section 50 inputs the transition data associated with the cycle into the second transition memory 60-2.

Such an operation makes it possible to easily analyze the jitter of the output signal, similarly to the case explained with reference to FIGS. 5A and 5B. For example, the test apparatus 100 can measure jitter in association with each of the states of the device under test 200 which are determined by the power consumption thereof.

Figure 9A:
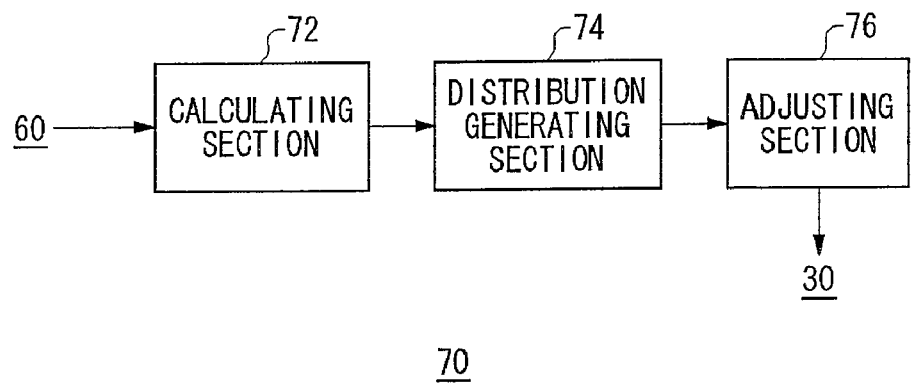
FIG. 9A illustrates an exemplary configuration of a processing section 70.

FIG. 9A illustrates an exemplary configuration of the processing section 70. The processing section 70 includes therein a calculating section 72, a distribution generating section 74, and an adjusting section 76. The calculating section 72 calculates the jitter of the output signal based on the respective pieces of transition data stored on the transition memory 60. The calculating section 72 may align along the time domain the values of the respective pieces of transition data stored on the transition memory 60. In this way, the calculating section 72 may obtain a jitter sequence indicating timing jitter in each cycle.

Alternatively, the calculating section 72 may obtain the jitter sequence by aligning along the time domain the values obtained by subtracting a predetermined reference value from the values of the respective pieces of transition data. In addition, the calculating section 72 may calculate, as the RMS value of the timing jitter of the output signal, the square mean value of the data values included in the jitter sequence. Moreover, the calculating section 72 may calculate, as the peak to peak value of the timing jitter of the output signal, a difference between the maximum and minimum values among the data values included in the jitter sequence.

When the test apparatus 100 includes therein a single transition memory 60, the calculating section 72 can calculate jitter which is generated when the device under test 200 is in a particular state, based on the pieces of transition data stored on the transition memory 60. When the test apparatus 100 includes therein a plurality of transition memories 60, the calculating section 72 may perform the above-described operation based on each of the transition memories 60. In this case, the calculating section 72 can calculate jitter which is generated when the device under test 200 is in each of the possible states.

The distribution generating section 74 generates a jitter distribution. For example, the distribution generating section 74 may generate, as the jitter distribution, a distribution of the respective values included in the jitter sequence calculated by the calculating section 72. Also, the distribution generating section 74 may generate a jitter distribution based on each of the jitter sequences which are respectively generated by the calculating section 72 in correspondence with the plurality of transition memories 60.

The adjusting section 76 adjusts the time intervals between the plurality of strobe signals generated by the multi-strobe generating section 30, based on the RMS value or peak to peak value of the timing jitter calculated by the calculating section 72, or the jitter distribution generated by the distribution generating section 74. The adjusting section 76 may adjust the time intervals between the strobe signals by adjusting the delay amounts of the delay elements 32.

For example, the adjusting section 76 may adjust the delay amounts of the delay elements 32 so that the time intervals between the strobe signals become smaller than the RMS value of the timing jitter. Here, the distribution generating section 74 may calculate the peak to peak value of the deterministic jitter of the jitter DJ based on the jitter distribution. Generally speaking, jitter contains therein deterministic jitter and a random jitter. The deterministic jitter is a reproducible jitter component which is generated by deterministic factors such as the circuit characteristics and data patterns. The deterministic jitter may be, for example, sinusoidal jitter. On the other hand, the random jitter may be a jitter component which is generated by uncertain factors such as thermal noise.

Figure 9B:
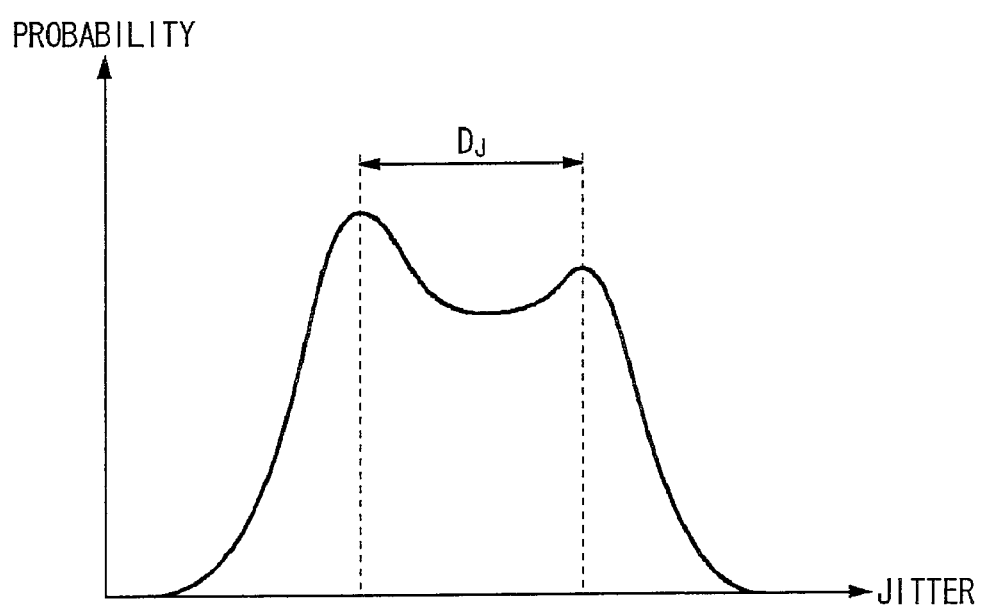
FIG. 9B illustrates an example of a jitter distribution.

FIG. 9B illustrates an example of the jitter distribution. In FIG. 9B, the jitter value is plotted along the horizontal axis and the probability at which each jitter value is observed is plotted along the vertical axis. The distribution generating section 74 may generate the probability density distribution shown in FIG. 9B based on the jitter sequence.

As mentioned above, the jitter contains therein the deterministic and random jitter. The deterministic jitter has a variation of the amplitude (the jitter value) within a predetermined range, such as sinusoidal jitter. Accordingly, the probability density of the deterministic jitter is zero outside the predetermined amplitude range.

On the other hand, the probability density distribution of the random jitter is represented by, for example, a Gaussian distribution. Therefore, the probability density distribution of the jitter containing therein the deterministic and random jitter is obtained as a combination of the probability density distribution of the deterministic jitter and a Gaussian distribution (the random jitter) at each of the amplitude boundaries of the deterministic jitter, as illustrated in FIG. 9B.

As mentioned above, the distribution generating section 74 may calculate the peak to peak value of the deterministic jitter of the jitter DJ based on the jitter distribution. For example, the distribution generating section 74 may calculate the peak to peak value DJ by obtaining the inter-peak distance of the jitter distribution. The adjusting section 76 may adjust the delay amounts of the delay elements 32 so that the time intervals between the strobe signals become smaller than the peak to peak value of the deterministic jitter of the jitter DJ.

The jitter of the output signal can be accurately measured by adjusting the time intervals between the strobe signals as described above. When a plurality of pieces of timing jitter and a plurality of peak to peak values of the deterministic jitter are obtained in association with the plurality of states of the device under test 200, the adjusting section 76 may adjust the time intervals between the strobe signals based on the timing jitter or the peak to peak value of the deterministic jitter which is obtained in association with one of the states. For example, the adjusting section 76 may adjust the time intervals between the strobe signals based on the timing jitter or the peak to peak value of the deterministic jitter which is obtained in association with a state of the device under test 200 which is designated by the user or the like. Alternatively, the adjusting section 76 may adjust the time intervals between the strobe signals based on the smallest timing jitter or the smallest peak to peak value of the deterministic jitter.

Figure 10A:
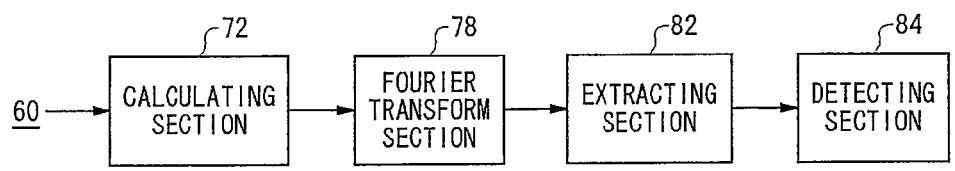
FIG. 10A illustrates another exemplary configuration of the processing section 70.

FIG. 10A illustrates another exemplary configuration of the processing section 70. According to the present example, the processing section 70 includes therein the calculating section 72, a Fourier transform converter 78, an extracting section 82 and a detecting section 84. The calculating section 72 may be the same as the calculating section 72 explained with reference to FIG. 9A.

Figure 10B:
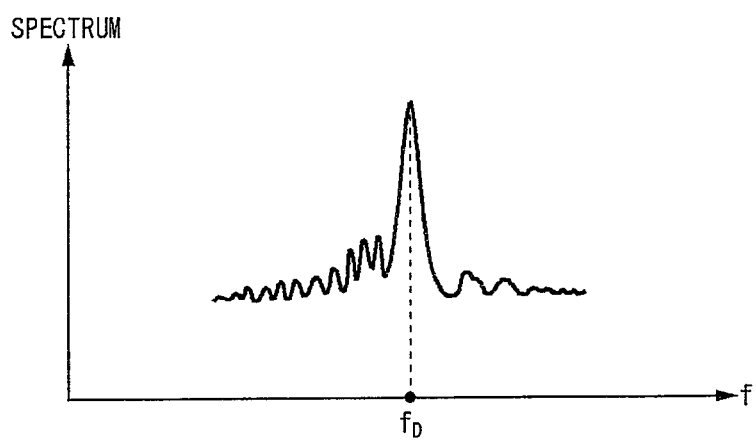
FIG. 10B illustrates an example of a spectrum of a jitter sequence.

The Fourier transform converter 78 transforms the jitter sequence in the time domain which is generated by the calculating section 72 into a spectrum in the frequency domain. For example, the Fourier transform converter 78 may perform Fourier transform on the jitter sequence. FIG. 10B illustrates an example of the spectrum obtained based on the jitter sequence.

The extracting section 82 detects a frequency fD at which the frequency component peaks in the spectrum generated by the Fourier transform converter 78. The extracting section 82 may detect a frequency at which the largest peak is seen. Here, the frequency fD corresponds to the frequency of the deterministic jitter of the jitter (for example, sinusoidal jitter). The extracting section 82 may detect a frequency at which the largest peak is seen.

Figure 11A:
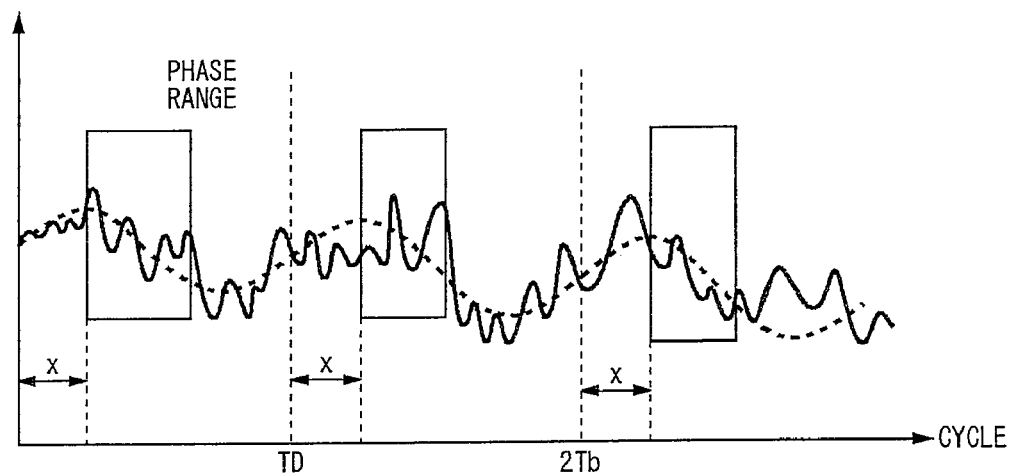
FIG. 11A illustrates an example of a jitter sequence of an output signal which is generated by a calculating section 72.

The extracting section 82 divides the jitter sequence of the output signal which is generated by the calculating section 72 in units of the period TD corresponding to the detected frequency fD. FIG. 11A illustrates an example of the jitter sequence of the output signal which is generated by the calculating section 72. In FIG. 11A, a sine wave having the frequency fD is indicated by the dotted line. Having the largest peak at the frequency fD, the jitter sequence has a waveform in which the component of the sine wave having the frequency fD appears relatively significantly as illustrated in FIG. 11A.

The extracting section 82 extracts a data sequence within a predetermined phase range, from each of the regions obtained by the division. The extracting section 82 then calculates a mean value of the data values included in the entire phase range (a mean jitter amount). Furthermore, the extracting section 82 sequentially varies the position x of the phase range, and calculates the mean jitter amount in association with each position of the phase range.

Figure 11B:
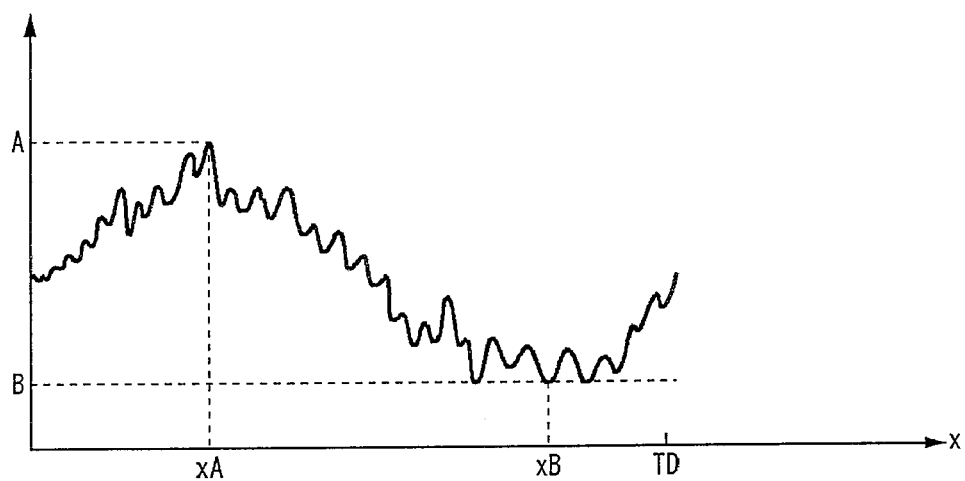
FIG. 11B illustrates, as an example, mean jitter amounts which are calculated in association with the respective positions of the phase range.

FIG. 11B illustrates, as an example, the mean jitter amount which is calculated for each position of the phase range. The detecting section 84 may detect a position xA of the phase range which is associated with the largest value among the mean jitter amounts calculated by the extracting section 82. Also, the detecting section 84 may detect a mean jitter amount A associated with the position xA of the phase range.

In addition, the detecting section 84 may detect a position xB of the phase range which is associated with the smallest value among the mean jitter amounts calculated by the extracting section 82. Also, the detecting section 84 may detect a mean jitter amount B associated with the position xB of the phase range. Such an operation makes it possible to analyze the jitter of the output signal. For example, the detecting section 84 may calculate the difference between the detected largest and smallest values A and B of the mean jitter amount, as the peak to peak value of the deterministic jitter of the jitter. Also, the detecting section 84 may calculate the frequency fD, as the frequency of the deterministic jitter.

The processing section 70 may perform the series of operations explained with reference to FIGS. 10 and 11 in association with each of the states of the device under test 200. To be specific, the processing section 70 may perform the series of operations explained with reference to FIGS. 10 and 11 on the data sequence generated based on the pieces of transition data stored on each of the transition memories 60.

Although an aspect of the present invention has been described by way of an exemplary embodiment, it should be understood that those skilled in the art might make many changes and substitutions without departing from the spirit and the scope of the present invention which is defined only by the appended claims.

As is apparent from the above description, an embodiment of the present invention can realize a test apparatus which is capable of easily analyzing the jitter of an output signal.

What is claimed is:

1. A test apparatus for testing a device under test, comprising:
   a multi-strobe generating section that generates a plurality of strobe signals with different phases in each of cycles of an output signal output from the device under test;
   a plurality of timing comparing sections that obtain a value of the output signal respectively at timings of the plurality of strobe signals;
   a transition detecting section that generates transition data identifying one of the plurality of strobe signals which is positioned at a transition of the output signal, based on the values of the output signal which are respectively obtained at the timings of the plurality of strobe signals;
   a plurality of transition storing sections that store thereon the transition data input thereto;
   a selecting section that selects, in association with each of the cycles of the output signal, whether to input and into which one of the plurality of transition storing sections to input the transition data output from the transition detecting section, in accordance with a state associated with the device under test; and
   a calculating section that calculates jitter of the output signal based on the transition data stored on the transition storing section.

2. The test apparatus as set forth in claim 1, wherein the transition detecting section detects a timing of the transition of the output signal output from the device under measurement in each of successive cycles within a predetermined time duration, and stores the detected timings onto one of the plurality of transition storing sections.

3. The test apparatus as set forth in claim 1, comprising a pattern generator that generates an expected pattern signal indicating an expected value for the output signal, when the test apparatus performs a function test to judge whether the output signal output from the device under test is acceptable, wherein
   the pattern generator generates an enable signal that designates whether the jitter of the output signal is to be measured in association with each of the cycles, when the test apparatus performs a jitter test for measuring the jitter of the output signal output from the device under test, and
   the selecting section inputs the transition data into one of the plurality of transition storing sections, in association with a cycle for which the enable signal designates that the jitter of the output signal is to be measured.

4. The test apparatus as set forth in claim 3, wherein when the test apparatus performs the jitter test for measuring the jitter of the output signal output from the device under test, the pattern generator generates (i) an enable signal that designates whether the jitter of the output signal is to be measured in association with each of the cycles and (ii) a memory control signal that designates one of the plurality of transition storing sections which is to store thereon the transition data in association with each of the cycles, and
   in association with a cycle for which the enable signal designates that the jitter of the output signal is to be measured, the selecting section inputs the transition data into one of the plurality of transition storing sections which is designated by the memory control signal.

5. The test apparatus as set forth in claim 1, comprising a pattern generator that generates an expected pattern signal indicating an expected value for the output signal, when the test apparatus performs a function test for judging whether the output signal output from the device under test is acceptable, wherein
   the selecting section inputs the transition data into one of the plurality of transition storing sections in association with such a cycle that the expected pattern signal takes a predetermined value, when the test apparatus performs a jitter test for measuring the jitter of the output signal output from the device under test.

6. The test apparatus as set forth in claim 1, comprising:
   a pattern generator that generates a test pattern to be supplied to the device under test by executing a test program used for testing the device under test; and
   a range setting register that stores thereon a range for a value of a program counter included in the pattern generator, which indicates a range in the program for which the jitter of the output signal is to be measured while the test program is being executed, wherein
   the selecting section sequentially inputs the transition data into one of the plurality of transition storing sections in each of the cycles, under a condition that the value of the program counter falls within the range designated by the range setting register while the test program is being executed.

7. The test apparatus as set forth in claim 6, comprising a plurality of range setting registers, wherein
   each of the plurality of transition storing sections is associated with one of the plurality of range setting registers, and
   when the value of the program counter falls within a range designated by one of the plurality of range setting registers while the test program is being executed, the selecting section sequentially inputs the transition data into one of the plurality of transition storing sections which is associated with the one range setting register.

8. The test apparatus as set forth in claim 1, wherein the device under test outputs the output signal and a state signal whose value varies in accordance with an internal state of the device under test, and
   the selecting section selects whether to sequentially input the transition data into one of the plurality of transition storing sections, in accordance with the value of the state signal.

9. The test apparatus as set forth in claim 8, wherein
   the selecting section selects one of the plurality of transition storing sections which is to store thereon the transition data, in accordance with the value of the state signal.

10. The test apparatus as set forth in claim 1, further comprising
    a power measuring section that measures power consumption of the device under test, wherein
    the selecting section selects whether to sequentially input the transition data into one of the plurality of transition storing sections, in accordance with the power consumption of the device under test.

11. The test apparatus as set forth in claim 10, wherein the selecting section selects one of the plurality of transition storing sections which is to store thereon the transition data, in accordance with the power consumption of the device under test.

12. The test apparatus as set forth in claim 1, comprising:

a Fourier transform converter that transforms a jitter sequence of the output signal which is calculated by the calculating section into a frequency domain;

an extracting section that extracts a data sequence within a predetermined phase range from the jitter sequence of the output signal, in association with each of periods which are determined in accordance with a frequency at which a frequency component peaks in the frequency domain; and a detecting section that extracts a plurality of data sequences by varying a position of the phase range in each of the periods, and detects a position of the phase range which is associated with a largest mean value of data values included in the phase range.

13. The test apparatus as set forth in claim 1, comprising:

a distribution generating section that generates a distribution of the jitter of the output signal; and an adjusting section that adjusts time intervals between the plurality of strobe signals generated by the multi-strobe generating section, in accordance with the distribution of the jitter.

14. The test apparatus as set forth in claim 1, wherein the plurality of transition storing sections are a plurality of transition memories that sequentially store thereon the transition data input thereto.

15. The test apparatus as set forth in claim 1, wherein the plurality of transition storing sections are a plurality of transition counters that count the number of times at which the transition is detected in association with each position of the transition.

* * * * *